POWER JET CLOCKING

Filed June 5, 1963

INVENTOR

HERBERT F. WELSH

BY Griffin and Stokes

ATTORNEYS

United States Patent Office 3,199,781
Patented Aug. 10, 1965

3,199,781
POWER JET CLOCKING

Herbert F. Welsh, Philadelphia, Pa., assignor to Sperry Rand Corporation, New York, N.Y., a corporation of Delaware Filed June 5, 1963, Ser. No. 285,759
7 Claims. (Cl. 235—201)

The present invention relates to methods and means for clocking or timing the transfer of signals in pure fluid logic systems.

In electronic logic systems such as those employed in digital data processors and control devices various undesirable factors distort the shape of signals and cause variations in signal timing. In some instances it becomes necessary to reshape and retime the signals and this is accomplished by means of special clocked gates or clocked pulse formers.

In fluid logic systems, as in electronic logic systems, the clocking may be accomplished in special clocked gates or pulse formers. The present invention eliminates the need for these devices by providing pulsed power to the power jets of fluid amplifiers or gates where reshaping and retiming are desired. A few high-power amplifiers in the clock may provide this pulsed power thus eliminating the need for many clocked gates and pulse formers in the logic systems.

Accordingly, an object of this invention is to provide a method and means for reshaping and retiming signals in a fluid logic system by providing pulsed power streams to the fluid amplifiers where reshaping and retiming are desired.

An object of this invention is to provide an improved method and means for timing signals in fluid logic systems, said method and means requiring less power and fewer elements than heretofore required.

An object of this invention is to provide a fluid logic system having a first network of logic elements and a second network of logic elements, a first plurality of bistable fluid amplifiers responsive to control signals from said second network for applying signals to said first network, a second plurality of bistable fluid amplifiers responsive to control signals from said first network for applying signals to said second network, a two-phase clock for alternately producing fluid signals of a first phase or a second phase, means for applying fluid signals of said first phase to the power stream nozzles of the amplifiers of said first plurality of amplifiers, and means for applying fluid signals of said second phase to the power stream nozzles of the amplifiers of said second plurality of amplifiers.

An object of this invention is to provide a fluid logic system having N logic networks, N groups of bistable fluid amplifiers each responsive to signals from one of said networks for controlling another of said networks, and clocking means for intermittently applying fluid clock pulses to the power stream nozzles of the amplifiers in each of said groups whereby said amplifiers are rendered operative one group at a time.

A further object of this invention is to provide a method and means for timing the transfer signals in a fluid logic system, said method and means requiring less power than heretofore. Normally, a bistable fluid amplifier requires a certain minimum value control signal to switch it from one stable state to the other. This minimum value is determined in part by the locking force which tends to hold the amplifier in one or the other of its stable states. In amplifiers of the type described in Patent No. 3,001,698 to Warren this locking force is present in the form of a low pressure region created by the power stream and existing between the power stream and one wall of the amplifier. In amplifiers of the type described in application Serial No. 135,824, filed September 5, 1961, this locking force is present in the form of a vortex flow created by the power stream and exerting a positive pressure on one side of the power stream.

Thus, in both types of amplifiers the control signal for switching the amplifier must be of sufficient magnitude to overcome a force created by the power stream. In accordance with one embodiment of the present invention the power stream is not flowing at the time the control signal is applied. With the control signal being applied, a small fluid flow is created in the amplifier chamber which determines the direction of power stream flow at the instant the power stream is turned on. Therefore, the control signal may be very small and still control the direction of power stream flow through the amplifier.

Another feature of the invention, present in one embodiment, is the provision of means for reshaping and retiming signals in a single phase fluid logic system.

Other objects of the invention and its mode of operation will become apparent upon consideration of the following description and the accompanying drawings in which:

FIGURE 1 illustrates a two-phase logic system;

Figure 7A:
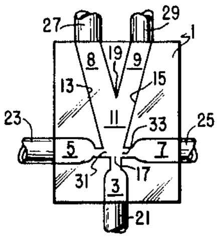
Figure 7B:
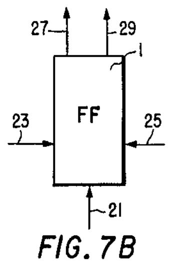

FIGURE 7*a* shows a bistable fluid amplifier suitable for use in the present invention; and FIGURE 7*b* shows the logic symbol employed in the drawings to represent a bistable fluid amplifier.

Referring first to FIGURE 7*a*, there is shown a flip-flop or bistable fluid amplifier 1 of the type disclosed in Patent No. 3,001,698 to Warren. The amplifier comprises a substantially solid body having formed therein a power stream nozzle 3, first and second control stream nozzles 5 and 7, and first and second output signal passageways 8 and 9. The output channels intersect at one end to form an interaction chamber 11. Opposing walls 13 and 15 are offset from the edges of orifice 17 where the power stream nozzle connects with the chamber. A dividing element 19 is formed where the walls of passageways 8 and 9 intersect. Preferably, chamber 11 is symmetrically arranged with respect to orifice 17 and the knife edge of dividing element 19 is located on the center line of the orifice.

A fluid conveying means, illustrated in the drawing as pipe 21, is connected to the power stream nozzle for the purpose of applying a fluid power stream to the nozzle from an external source. In like manner, fluid conveying means 23 and 25 are connected to control stream nozzles 5 and 7 for the purpose of applying fluid control streams to these nozzles from external sources. Suitable fluid conveying means such as pipes 27 and 29 are connected to output passageways 8 and 9, respectively, for the purpose of conveying output signals from the amplifier to other fluid actuated devices.

As explained in the aforementioned patent to Warren, an amplifier of the type shown in FIGURE 7*a* may be operated by continuously applying fluid to the power stream nozzle 3 and selectively applying fluid signals to control stream nozzles 5 and 7. Assuming chamber 11 is perfectly symmetrical and assuming that no control signals are applied to nozzles 5 and 7, fluid applied to power stream nozzle 3 emerges from orifice 17 at a high velocity jet stream and strikes dividing element 19 so that the jet stream divides into equal parts and flows into output passageways 8 and 9. In actual practice perfect symmetry is difficult to obtain and as a result the power jet issuing from orifice 17 normally locks on to wall 13 or wall 15 and all of the fluid in the power stream flows into passageway 8 or passageway 9.

The high velocity jet stream issuing from orifice 17 withdraws molecules of fluid from the regions between the jet stream and walls 13 and 15. If one of the walls, say wall 13, is closer to the jet stream than the other wall then the power jet withdraws more molecules of fluid from the region adjacent wall 13 than it withdraws from the region adjacent wall 15. This reduces the pressure in the region adjacent wall 13 to a value less than the pressure in the region adjacent wall 15 and a force is created which deflects the power jet closer to wall 13. As the power jet moves closer to wall 13 it becomes more efficient in withdrawing molecules of fluid from this region and less efficient in withdrawing molecules of fluid from the region adjacent wall 15. This bends the power jet so that it flows even closer to wall 13. The action is self-sustaining and in a very short time the power jet issuing from orifice 17 locks on to the wall 13 as a result of the low pressure region or "boundary layer" adjacent the wall and flows into passageway 8. Power jet flow along wall 13 into passageway 8 defines one stable state of the amplifier and this state is maintained as long as a fluid power stream is applied to nozzle 3 and no control signals are applied to nozzle 5.

The amplifier may be switched to a second stable state wherein the power jet issuing from orifice 17 flows along wall 15 and into passageway 9. This may be accomplished by applying fluid to control stream nozzle 5. The fluid applied to nozzle 5 emerges from orifice 31 and enters the low pressure region adjacent wall 13. If nozzle 5 supplies more fluid to this region than can be removed from this region by the action of the power jet then the pressure in the region adjacent wall 13 increases. When the pressure in this region is increased sufficiently the power jet breaks away from wall 13 and begins to swing toward dividing element 19. The fluid entering chamber 11 through orifice 31 creates a pressure in the region between the power jet and wall 13 which is greater than the pressure in the region between the power jet and wall 15. The resulting force deflects the power jet so that it flows closer to wall 15. Once the power jet is deflected to the right of dividing element 19 it becomes more efficient in withdrawing molecules of fluid in the region adjacent wall 15 thus reducing the pressure in this region to an even lower value. This causes the power jet to move even closer to wall 15 and in a very short time the power jet locks on to wall 15 and flows into passageway 9. This condition represents a second stable state of the amplifier and is maintained as long as fluid is applied to nozzle 3 and no control stream is applied to nozzle 7.

The amplifier may be switched back to its first stable state wherein the power stream flows along wall 13 by applying a stream of fluid to nozzle 7 to disrupt the low pressure region along wall 15.

As explained above, the bistable amplifier of FIGURE 7*a* maintains its first or its second state as long as the power stream is continuously applied to nozzle 3 and no control streams are applied to nozzles 5 or 7. In order to switch the amplifier from one stable state to the other the control stream applied to either nozzle 5 or 7 must have sufficient power to disrupt the boundary layer existing between the power jet stream and one of the chamber walls.

The control stream power required to switch the bistable amplifier may be materially reduced by intermittently terminating the power jet stream and then reinitiating the power jet stream in the presence of a control stream. The control stream may be initiated while the power stream is not applied to the amplifier or, if the control stream is of a magnitude less than that required to switch the amplifier, it may be initiated even before the power stream is terminated.

Referring again to FIGURE 7*a*, this mode of operation may be explained in the following manner. Assume that a power stream is being applied to nozzle 3 and the power jet is locked on to wall 13 so that it flows out through passageway 8. Assume further that it is desired to switch the amplifier so that the power jet stream locks on to wall 15 and flows out through passageway 9. A control stream is applied to nozzle 5. The magnitude of this control stream is limited to a value less than that required to disrupt the boundary layer along wall 13 and switch the amplifier.

Next, the power jet flow through chamber 11 is terminated by terminating the stream of fluid being applied to nozzle 3. The control stream continues to issue from nozzle 5 and, since orifice 31 is adjacent to orifice 17 and at a substantially right angle with respect thereto, creates a small flow of fluid across orifice 17.

After the flow of fluid across orifice 17 is established the power jet stream is reinitiated by again applying fluid to nozzle 3. As the power jet first emerges from orifice 17 it is deflected by the small control flow from orifice 31 so that it moves closer to wall 15 than to wall 13. Once the power jet stream has begun to flow closer to wall 15 than to wall 13 it creates a low pressure region adjacent wall 15 and locks on to this wall in the manner described above. Thus, amplifier 1 is switched from its first to its second stable state by terminating the power stream and then reinitiating the power stream while a control stream is being applied to nozzle 5. Since the control stream does not have to overcome the effects of a boundary layer, the control stream may be smaller than usual and still control the direction of flow of the power stream. In fact, the control stream power required to determine the direction of flow of the power stream approaches zero as the symmetry of chamber 11 approaches perfection.

Amplifier 1 may be switched back to its first state by again terminating the power stream and then initiating the power stream while a small control stream is applied to nozzle 7.

FIGURE 7*b* shows a symbol employed in the drawing to represent a bistable amplifier. Elements 21, 23, 25, 27 and 29 are the pipes or other means for applying fluid to or conveying fluid from the amplifier. Corresponding elements in each of the figures bear the same reference numeral.

FIGURE 1 is a block diagram of a two-phase fluid logic system wherein the reshaping and retiming of pulses is accomplished in accordance with the principles of the present invention. The system comprises a first logic network A, a second logic network B, a first plurality of bistable amplifiers (phase A), a second plurality of bistable amplifiers (phase B) and an oscillator or clock pulse generator 39.

Fluid output signals developed by logic network A are applied by means of a first plurality of pipes 23 and 25 to the control nozzles of the phase B amplifiers. In like manner, fluid output signals developed by logic network B are applied by means of a second plurality of pipes 23 and 25 to the control nozzles of the phase A amplifiers. These connections are indicated in a general fashion by the heavier lines. Connecting pipes 27 and 29 convey output signals from the phase B amplifiers to the inputs of logic network B and convey output signals from the phase A amplifiers to the inputs of logic network A.

Figure 2:
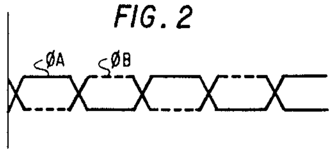
FIGURE 2 illustrates the waveform of clock pulses produced by a two-phase clock pulse generator.

The pulse generator alternately produces fluid pulses at two outputs. Those produced at one output are designated phase A pulses and those produced at the other output are designated phase B pulses. FIGURE 2 shows the idealized waveforms for the phase A and phase B clock pulses and illustrates how the magnitudes of the pulses may vary as a function of time. Pulse generator 39 may be of the type disclosed in copending application Serial No. 189,529, filed April 23, 1962.

The phase A clock pulses are conveyed by means of a pipe 40 to the power stream inputs of the phase A amplifiers and the phase B clock pulses are conveyed by means of a pipe 42 to the power stream inputs of the phase B amplifiers. Since the phase A and phase B clock pulses occur alternately in time it is obvious that power streams flow alternately in the phase A and phase B amplifiers.

The present invention is not limited in its use to any specific logic system. Therefore, logic networks A and B are intended to represent any combinations of digital fluid operated elements for performing control or computing functions. They may, for example, represent the fluid logic elements which are employed in a counter or shift register. It thus becomes obvious that the number of phase A and phase B amplifiers need not be the same and may vary depending upon the number of inputs to or outputs from, the logic networks.

In some instances it may be desirable to enter new data or signals directly into one or the other or both logic networks while in other instances it may be desirable to apply the new data to one of the logic networks through the amplifiers associated therewith. In the latter case additional amplifiers may be provided with these amplifiers having their power stream nozzles connected to the appropriate output of the clock pulse generator and their control nozzles connected to the external data source. Data may be read out of the system by providing taps on pipes 27 and 29 for sampling the output signals from the amplifiers.

The logic system of FIGURE 1 operates as follows. Assume that the clock pulse generator is nearing the end of phase A. At this time fluid is flowing from the pulse generator over pipe 40 and pipes 21 to the power stream nozzles of the phase A amplifiers. The individual phase A amplifiers are in their first or second state depending upon the signals being received from logic network B as phase A began. Thus, fluid signals are being applied to logic network A by the phase A amplifiers over selected ones of the pipes 27 and 29. Logic network A is responding to these signals and is applying fluid signals over selected ones of the pipes 23 and 25 to the control nozzles of the phase B amplifiers. The phase B amplifiers receive no power stream fluid from the pulse generator during phase A hence these amplifiers are producing no output signals.

At the end of phase A the clock pulse generator stops applying fluid to the power stream nozzles of the phase A amplifiers and begins applying fluid to the power stream nozzles of the phase B amplifiers. As the power streams begin to flow each phase B amplifier assumes one of its two stable states depending upon whether it receives a control signal over pipe 23 or over pipe 25 from logic network A. As soon as each phase B amplifier assumes one of its stable states it begins supplying a fluid signal to logic network B over one of the pipes 27 or 29.

Logic network B performs the desired logical operations on the signals applied to it and, after a slight delay, begins producing output signals which are applied over selected ones of pipes 23 and 25 to control nozzles 5 and 7 of the phase A amplifiers. However, the clock pulse generator does not apply fluid to the power stream nozzles of the phase A amplifiers during phase B time so the signals produced by logic network B have no effect at this time.

At the end of phase B time the clock pulse generator applies fluid to the power stream nozzles of the phase A amplifiers and terminates the fluid stream applied to the power stream nozzles of the phase B amplifiers.

As the power streams begin to flow in the phase A amplifiers each of these amplifiers is selectively set to its first or second stable state depending upon whether it is receiving a control signal over a pipe 23 or pipe 25. The output signals from the phase A amplifiers are applied to logic network A and, after a slight delay, this logic network produces output signals which are applied to the control nozzles of the phase B amplifiers.

As the power streams terminate in the phase B amplifiers these amplifiers stop applying input signals to the logic network B and after a slight delay the output signals from network B terminate.

The sequence of events just described comprises one complete cycle of operation of the system. This sequence is carried out repeatedly as long as the clock pulse generator alternately applies fluid to the power stream nozzles of the amplifiers.

As noted above, there is a delay between the time a fluid input signal is applied to one of the inputs of the logic networks and the time a resulting fluid signal is produced at one of the outputs of the network. The duration of this delay is dependent upon many factors such as the length of a particular fluid path through the network, the switching time of the logical elements through which a signal passes in traversing the network, and so forth. Therefore, each of the output signals produced by a logic network may occur at a different time. However, these signals are retimed by the bistable amplifiers of the opposite phase so that they are applied simultaneously to the logic network of the opposite phase.

The theoretical maximum permissible delay between the time a signal is applied to an input of one of the networks and the time a resulting output signal is produced is one-half cycle or the duration of one phase. In actual practice the maximum permissible delay in a network must be less than one-half cycle in order to allow for additional delays such as, for example, the delays encountered by signals traversing the pipes 23 and 25 from the output of a logic network of one phase to the amplifiers of the other phase.

The phase A and phase B amplifiers also amplify as well as retime the signals being transferred. This amplification is accomplished in the amplifiers by controlling the direction of flow of the power streams with the control signals of relatively low power produced by the networks. Furthermore, since the control signals do not have to overcome the forces inducing lock-on in the amplifiers, the degree of amplification is made greater without changing the design characteristics of the amplifiers. This permits the use of conventional amplifiers for the clocking function while at the same time reducing the amount of amplification required in the logic networks. This is true whether the amplifiers are of the type shown in FIGURE 7*a*, vortex amplifiers of the type disclosed in the aforementioned application Serial No. 135,824, or one of several other known types.

Figure 3:
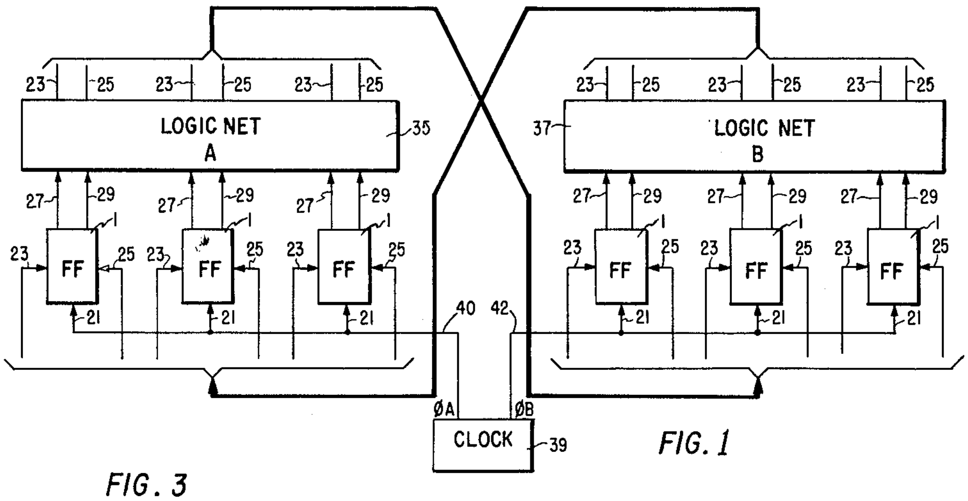
FIGURE 3 illustrates a four-place logic system.

The present invention is not limited in scope to the timing of two-phase systems but may be employed in systems operating under the control of an N phase clock pulse generator, N being any whole number. FIGURE 3 is a block diagram showing a four-phase system. The system includes logic networks A, B, C and D, four groups of bistable amplifiers 41, 43, 45 and 47 and a four-phase clock pulse generator 65.

Figure 4:
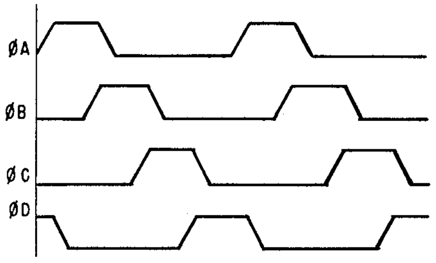
FIGURE 4 illustrates the waveform of clock pulses produced by a four-phase clock pulse generator.

The clock pulse generator produces phase A, phase B, phase C and phase D fluid clock pulses in sequence and these pulses are applied to the power nozzles of the phase A, phase B, phase C and phase D amplifiers (flip-flops) over the connecting pipes 57, 59, 61 and 63, respectively. The timing of these pulses may be as shown in FIGURE 4.

Logic networks A, B, C and D and the four groups of bistable amplifiers are connected to form a closed loop with one group of amplifiers between successive networks. That is, output signals from logic network A pass through the phase B amplifiers and are applied to logic network B. Output signals from logic network B pass through the phase C amplifiers and are applied to logic network D, and so forth. The heavier lines each represents a plurality of connecting pipes. Data or signals from external sources may be entered into the system in the same manner as explained with reference to FIGURE 1.

The operation of the four-phase system is similar to that of the two-phase system previously described, hence a detailed explanation is not given. The primary difference is that a particular network and its associated amplifiers are active on one phase out of four rather than one phase out of two as is the case with FIGURE 1.

Figure 5:
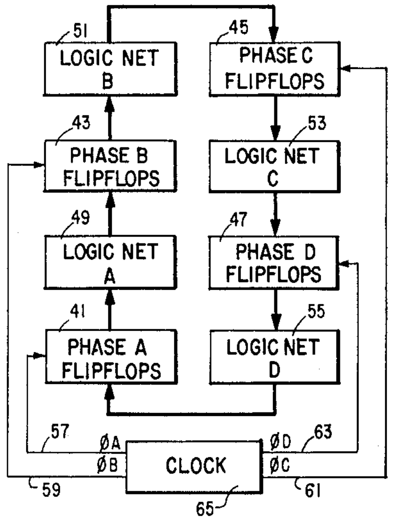
FIGURE 5 shows a single phase logic system.
Figure 6:
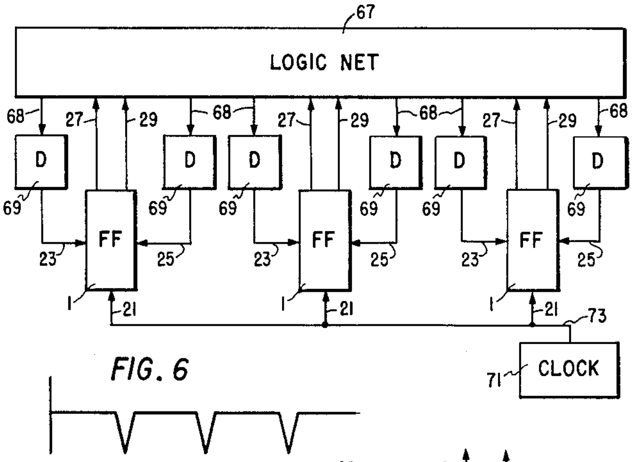
FIGURE 6 illustrates the waveform of clock pulses produced by a single phase clock pulse generator.

FIGURE 5 shows a single phase system constructed in accordance with the principles of the present invention. This system includes a plurality of bistable amplifiers 1, a logic network 67, a plurality of delay elements 69 and a clock pulse generator 71.

The clock pulse generator continuously produces a series of fluid clock pulses at its output and these pulses are applied by way of pipes, ducts or other fluid conveying means 73 and 21 to the power stream nozzles of each of the amplifiers. The output signals produced by the amplifiers are applied by way of pipes 27 and 29 to the logic network which in turn produces fluid output signals on pipes 68.

Each pipe 68 is connected to a delay element 69 and the output of each relay element is connected by way of a pipe 23 or 25 to a control nozzle of one of the amplifiers. The delay elements may be fluid capacitances such as one or more chambers interconnected by pipes so that a predetermined time elapses between the time a fluid signal is applied to the delay element and the time that signal appears at the output of the delay element.

In the embodiment shown in FIGURE 5 it is essential that the control streams produced in the amplifier chambers as a result of signals applied to the amplifiers over pipes 23 and 25 be of a magnitude less than that required to cause switching by disrupting an established boundary layer. That is, the control streams must be of sufficient magnitude to deflect power streams at the moment said streams are initiated but of insufficient magnitude to change the direction of power stream flow once that flow has been established.

The magnitude of the control streams may be limited by providing signal attenuators such as flow restrictors in pipes 68, pipes 23 and 25, and/or the control nozzles. No attenuators are shown in FIGURE 5 since their number and placement may vary. In fact, in some instances the signals applied to the logic network over pipes 27 and 29 may be sufficiently attenuated by the resistance inherent in logic network 67 so that the signals appearing on pipes 68 need not be further attenuated before being applied to the control nozzles.

As the clock pulse generator begins producing each clock pulse the power streams begin flowing in each of the amplifiers. As subsequently explained, each amplifier is at this time receiving a fluid control signal over a pipe 23 or a pipe 25. This control signal is of sufficient magnitude to control the direction of flow of the newly initiated power stream and thus determines whether the power stream flows out of the amplifier through pipe 27 or pipe 29. Once the power stream is established the boundary layer maintains the power stream in the same flow path even though the control signal may be terminated.

The output signals from the amplifiers (resulting from a particular clock pulse) are operated on in the logic network and cause a new set of output signals to be produced on pipes 68. After passing through delay elements 69 the new output signals from the network are applied to the control nozzles of the amplifiers. However, the clock pulse which activated the amplifier power streams to produce the new output signals from the network is still present at the time the new signals are applied to the amplifiers. Since the same clock pulse is still present the power streams are maintained in their same path of flow by the boundary layers and are not switched by the new signals. This explains why the magnitude of the signals must be limited.

At the end of the first clock pulse period the pulse generator stops supplying fluid to the amplifiers for a short interval. The duration of this interval is made great enough to insure that the power streams have stopped flowing in the chambers of all the amplifiers.

After this interval of time has elapsed the pulse generator produces another clock pulse and the power streams again begin to flow in all amplifiers. Because of the signal delay caused by the network and elements 69 the control signals in pipes 23 and 25 which were produced as a result of the previous clock pulse are still flowing thus creating small control streams in the amplifier chambers. These control streams deflect the newly initiated power streams to again apply signals to the network.

In summary, each clock pulse activates the amplifiers which produce output signals dependent upon the output signals of the network. Each time the amplifiers are activated they energize the network which generates new output signals to control the amplifiers at the time they are next activated.

The purpose of delay elements 69 is to insure that output signals produced by network 67 (in response to a first initiation of the power streams) are still being applied to the amplifiers at the time power streams are next initiated. If the inherent delay within the logic network is great enough to insure this condition then delay elements 69 are not required.

Although only preferred embodiments of the invention have been shown and described, various modifications therein falling within the spirit and scope of the invention will be obvious to those skilled in the art. For example, "single-sided" bistable amplifiers having one control signal input may be employed. In this case one of the output pipes 27 or 29 serves a fluid return and the presence or absence of fluid in the other pipe indicates the state of the amplifier and controls the network accordingly.

The embodiments of the invention in which an exclusive property or privilege is claimed are defined as follows:

1. The combination comprising: first and second logic networks; first and second groups of bistable fluid amplifiers, each amplifier having at least one control stream nozzle, a power stream nozzle, and an output signal passageway; connecting means for applying output signals from said first logic network to the control stream nozzles of the bistable amplifiers of said second group and output signals from said second logic network to the control stream nozzles of the bistable amplifiers of said first group; means for alternately applying power streams to the power stream nozzles of the amplifiers in said first and second groups whereby said first and second groups of amplifiers alternately produce fluid output signals; and further connecting means for applying output signals from said first group of amplifiers to said first logic network and applying output signals from said second group of amplifiers to said second logic network.

2. The combination comprising: first and second fluid logic networks each responsive to a plurality of fluid input signals for producing a plurality of fluid output signals; a first group of bistable fluid amplifiers each having at least one control signal nozzle, a power stream nozzle, and at least one output signal passageway; means for conveying output signals produced by said first logic network to control signal nozzles of the amplifiers in said first group; a second group of bistable fluid amplifiers each having at least one control signal nozzle, a power stream nozzle, and at least one output signal passageway; means for conveying output signals produced by said second logic network to control signal nozzles of the amplifiers in said second group; first clock pulse conveying means connected to the power stream nozzles of the amplifiers in said first group; second clock pulse conveying means connected to the power stream nozzles of the amplifiers in said second group; clock pulse generator means for alternately applying fluid clock pulses to said first and second clock pulse conveying means to thereby initiate power stream flow in the amplifiers in one of one of said groups at the time power stream flow is terminated in the amplifiers in the other of said groups; means for conveying fluid output signals from the passageways of said first group of amplifiers to said second logic network; and means for conveying fluid output signals from the passageways of said second group of amplifiers to said first logic network.

3. The combination comprising: first and second fluid logic networks each responsive to a plurality of fluid input signals for producing a plurality of fluid output signals; a first group of bistable fluid amplifiers each having first and second control signal nozzles, a power stream nozzle, and first and second output signal passageways; means for conveying output signals produced by said first logic network to said control signal nozzles of the amplifiers in said first group; a second group of bistable fluid amplifiers each having first and second control signal nozzles, a power stream nozzle, and first and second output signal passageways; means for conveying output signals produced by said second logic network to said control signal nozzles of the amplifiers in said second group; first clock pulse conveying means connected to the power stream nozzles of the amplifiers in said first group; second clock pulse conveying means connected to the power stream nozzles of the amplifiers in said second group; two-phase clock pulse generator means for alternately applying fluid clock pulses to said first and said second clock pulse conveying means to thereby initiate power stream flow in the amplifiers in one of said groups at the time power stream flow is terminated in the amplifiers in the other of said groups; means for conveying fluid output signals from the passageways of said first group of amplifiers to said second logic network; and means for conveying fluid output signals from the passageways of said second group of amplifiers to said first logic network.

4. The combination comprising: a logic network having a plurality of inputs for receiving fluid signals and a plurality of outputs at which fluid output signals appear; a plurality of bistable fluid amplifiers having at least one control signal nozzle, a power stream nozzle, and at least one output signal passageway; means connecting said output passageways to the inputs of said logic network and the outputs of said logic network to said control signal nozzles, said logic network having a maximum delay interval between the time input signals are applied to said network and the time fluid signals appear at the outputs of said network; and clock pulse means for periodically applying power streams to said power stream nozzles, said clock pulse means including means for repetitively generating said power streams for periods of time at least as long as said maximum delay interval and then terminating said power streams for a period of time sufficient to terminate power stream flow in said bistable amplifiers, said logic network and connecting means attenuating signals applied thereto to a magnitude insufficient to deflect said power streams from one stable state to the other when said attenuated signals are applied to said control signal nozzles, said attenuated signals being of sufficient magnitude to deflect power streams at the instant said power streams being to flow in said amplifiers.

5. The combination comprising: a logic network having a plurality of inputs for receiving fluid signals and a plurality of outputs at which fluid output signals appear; a plurality of bistable fluid amplifiers having at least one control signal nozzle, a power stream nozzle, and at least one output signal passageway; means connecting said output passageways to the inputs of said logic network; delay means responsive to fluid output signals from said logic network for applying delayed fluid signals to said control signal nozzles; a clock pulse generator for periodically generating fluid clock pulses of predetermined duration; and fluid conveying means for conveying said clock pulses to said power stream nozzles, the control stream nozzle of each amplifier being positioned to direct a fluid control stream across the path of power stream pulses entering the amplifier through its power stream nozzle to thereby control the flow of said power stream pulses into the output signal passageway of the amplifier, the attenuation of said logic network and delay means being such that power stream pulses applied to said logic network are reduced in magnitude before being applied to said control signal nozzles, said magnitude being sufficient to control the direction of flow of power stream pulses as the power stream pulses first begin to flow in said amplifiers but insufficient to change the direction of flow of the power streams after they have begun to flow, said network and said delay means having a total delay which is less than the duration of one of said clock pulses.

6. The combination comprising: a logic network having a plurality of inputs for receiving fluid signals and a plurality of outputs at which fluid output signals appear; a plurality of bistable fluid amplifiers having first and second control signal nozzles, a power stream nozzle, and first and second output signal passageways; means connecting said output passageways to the inputs of said logic network; delay means responsive to fluid output signals from said logic network for applying delayed fluid signals to said control signal nozzles; a clock pulse generator for periodically generating fluid clock pulses of predetermined duration; and fluid conveying means for conveying said clock pulses to said power stream nozzles, the control stream nozzles of each amplifier being positioned to direct a fluid control stream across the path of power stream pulses entering the amplifier through its power stream nozzle to thereby control the flow of said power stream pulses into the output signal passageways of the amplifier, the attenuation of said logic network and delay means being such that power stream pulses applied to said logic network are reduced in magnitude before being applied to said control signal nozzles, said magnitude being sufficient to control the direction of flow of power stream pulses as the power stream pulses first begin to flow in said amplifiers but insufficient to change the direction of flow of the power streams after they have begun to flow, said network and said delay means having a total delay which is less than the duration of one of said clock pulses.

7. The combination comprising: first and second logic networks; first and second groups of bistable fluid amplifiers, each of said amplifiers having power stream input means, control signal input means, and output signal means; means responsive to output signals from said first logic network for applying signals to the control signal input means of the bistable amplifiers of said second group; means responsive to output signals from said second logic network for applying signals to the control signal input means of the bistable amplifiers of said first group; connecting means for applying output signals from said first group of amplifiers to said first logic network and applying output signals from said second group of amplifiers to said second logic network; and means for alternately applying power streams to the power stream input means of the amplifiers in said first and second groups whereby said first and second groups of amplifiers alternately produce fluid output signals.

References Cited by the Examiner

UNITED STATES PATENTS 3,117,593 1/64 Sowers ............ 235—201 X

LEO SMILOW, *Primary Examiner.*

UNITED STATES PATENT OFFICE

CERTIFICATE OF CORRECTION

Patent No. 3,199,781 August 10, 1965

Herbert F. Welsh

It is hereby certified that error appears in the above numbered patent requiring correction and that the said Letters Patent should read as corrected below.

Column 8, lines 74 and 75, for "in one of one of said groups" read -- in one of said groups --.

Signed and sealed this 17th day of May 1966.

(SEAL)
Attest:

ERNEST W. SWIDER
Attesting Officer

EDWARD J. BRENNER
Commissioner of Patents